(12) United States Patent
Grötsch et al.

(10) Patent No.: US 8,684,540 B2
(45) Date of Patent: Apr. 1, 2014

(54) OPTICAL PROJECTION APPARATUS

(75) Inventors: Stefan Grötsch, Lengfeld-Bad Abbach (DE); Simon Kocur, München (DE); Matthias Sabathil, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 212 days.

(21) Appl. No.: 13/378,308

(22) PCT Filed: Jun. 15, 2010

(86) PCT No.: PCT/EP2010/058393
§ 371 (c)(1),
(2), (4) Date: Feb. 10, 2012

(87) PCT Pub. No.: WO2010/149539
PCT Pub. Date: Dec. 29, 2010

(65) Prior Publication Data
US 2012/0133908 A1    May 31, 2012

(30) Foreign Application Priority Data

Jun. 25, 2009  (DE) .......................... 10 2009 030 549

(51) Int. Cl.
G03B 21/20  (2006.01)
G03B 21/26  (2006.01)
F21V 9/00  (2006.01)
F21V 9/16  (2006.01)
F21V 23/02  (2006.01)

(52) U.S. Cl.
USPC ................. 353/94; 353/85; 359/84; 359/230; 359/231; 359/260

(58) Field of Classification Search
USPC ...................... 353/30–31, 33, 85, 94, 98, 122; 362/227, 230–231, 260, 555
See application file for complete search history.

(56) References Cited

U.S. PATENT DOCUMENTS

| | | | |
|---|---|---|---|
| 5,920,766 A * | 7/1999 | Floyd | 438/35 |
| 6,549,547 B2 | 4/2003 | Galvanauskas et al. | |
| 6,869,185 B2 * | 3/2005 | Kaminsky et al. | 353/31 |
| 6,895,138 B2 | 5/2005 | Toda et al. | |
| 7,279,716 B2 * | 10/2007 | Chen | 257/94 |
| 7,280,567 B2 | 10/2007 | Luo et al. | |

(Continued)

FOREIGN PATENT DOCUMENTS

| | | |
|---|---|---|
| DE | 20 2005 011 804 U1 | 10/2005 |
| JP | 03-209787 A | 9/1991 |

(Continued)

*Primary Examiner* — Georgia Y Epps
*Assistant Examiner* — Jori S Reilly-Diakun
(74) *Attorney, Agent, or Firm* — Slater & Matsil, L.L.P.

(57) ABSTRACT

An optical projection apparatus includes a first light source, a second light source, and an imaging element, which is illuminated by the first light source and the second light source during operation. The light source includes a light-emitting diode chip that emits red light during operation. The second light source includes a first light-emitting diode chip, which emits green light during operation. A second light-emitting diode chip emits blue light during operation. The second light-emitting diode chip is arranged on the first light-emitting diode chip at a radiation exit surface of the first light-emitting diode chip. Electromagnetic radiation generated in the first light-emitting diode chip during operation passes through the second light-emitting diode chip.

19 Claims, 5 Drawing Sheets

(56) References Cited

U.S. PATENT DOCUMENTS

| | | | |
|---|---|---|---|
| 7,462,873 B2 * | 12/2008 | Hoshi et al. | 257/88 |
| 7,518,150 B2 * | 4/2009 | Aihara | 257/79 |
| 7,939,844 B2 | 5/2011 | Hahn et al. | |
| 8,111,729 B2 * | 2/2012 | Sysak et al. | 372/50.121 |
| 8,567,960 B2 * | 10/2013 | El-Ghoroury et al. | 353/94 |
| 2003/0067773 A1 * | 4/2003 | Marshall et al. | 362/231 |
| 2005/0121662 A1 | 6/2005 | Park | |
| 2005/0219464 A1 | 10/2005 | Yamasaki et al. | |
| 2005/0219476 A1 * | 10/2005 | Beeson et al. | 353/98 |
| 2006/0170884 A1 * | 8/2006 | Liu | 353/100 |
| 2006/0215122 A1 | 9/2006 | Hong | |
| 2006/0262283 A1 | 11/2006 | Kurosaki | |
| 2006/0274288 A1 | 12/2006 | Conner | |
| 2007/0024822 A1 * | 2/2007 | Cortenraad et al. | 353/79 |
| 2007/0064407 A1 | 3/2007 | Huang et al. | |
| 2007/0159064 A1 | 7/2007 | Choi et al. | |
| 2008/0284329 A1 | 11/2008 | Bertram et al. | |
| 2009/0114931 A1 | 5/2009 | Hsueh et al. | |
| 2010/0171135 A1 | 7/2010 | Engl et al. | |
| 2011/0134019 A1 * | 6/2011 | Lee et al. | 345/76 |
| 2012/0292788 A1 * | 11/2012 | Choi | 257/777 |

FOREIGN PATENT DOCUMENTS

| | | |
|---|---|---|
| JP | 07-297448 A | 11/1995 |
| JP | 2003-332619 A | 11/2003 |
| JP | 2005-216917 A | 8/2005 |
| JP | 2005-283837 A | 10/2005 |
| JP | 2005-300663 A | 10/2005 |
| JP | 2006-319333 A | 11/2006 |
| JP | 2008-546023 A | 12/2008 |
| WO | WO 2010/120796 A2 | 10/2005 |
| WO | 2007094928 A1 | 8/2007 |

* cited by examiner

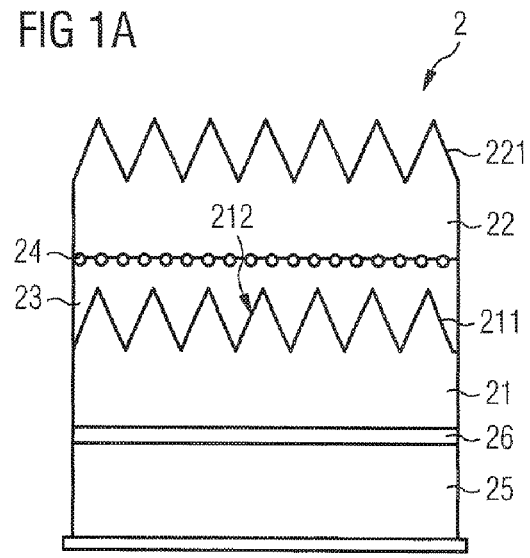
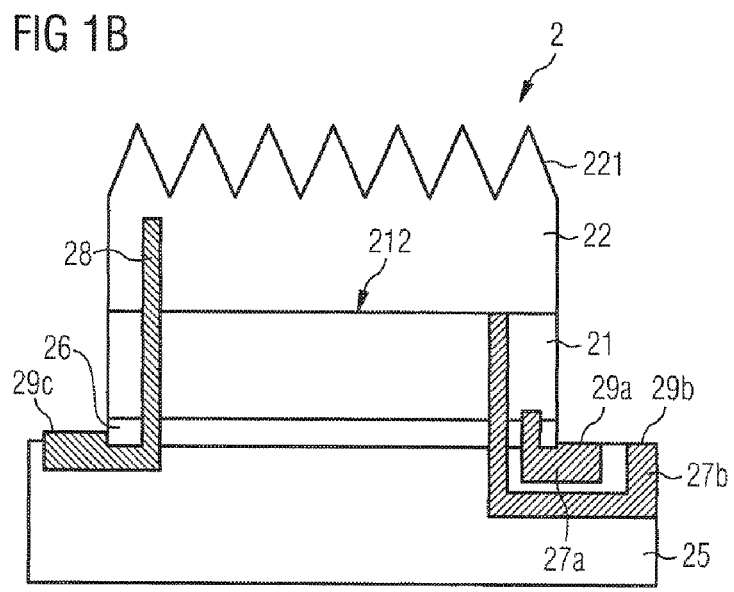

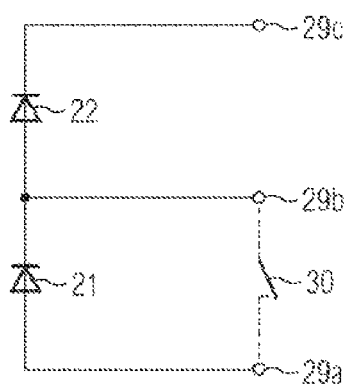
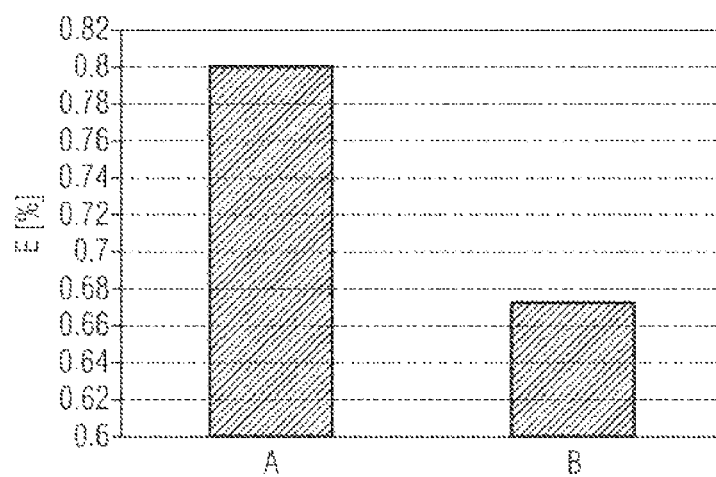

OPTICAL PROJECTION APPARATUS

This patent application is a national phase filing under section 371 of PCT/EP2010/058393, filed Jun. 15, 2010, which claims the priority of German patent application 10 2009 030 549.1, filed Jun. 25, 2009, each of which is incorporated herein by reference in its entirety.

TECHNICAL FIELD

An optical projection apparatus is specified.

SUMMARY OF THE INVENTION

In accordance with at least one embodiment of the optoelectronic projection apparatus, the optoelectronic projection apparatus has a first light source and a second light source. The optical projection apparatus therefore comprises two light sources. The optical projection apparatus is preferably a two-channel projection apparatus having only two light sources, the light from which can be mixed to form white light.

In accordance with at least one embodiment of the optical projection apparatus, the optical projection apparatus comprises an imaging element. The imaging element can be, for example, an LCD panel or a micromirror array. During the operation of the optical projection apparatus, the imaging element is illuminated by the first and the second light source. The imaging element modulates the light from the first and second light sources and in this way generates an image that is projected, for example, onto a projection area.

In accordance with at least one embodiment of the optical projection apparatus, the first light source comprises a light-emitting diode chip that emits red light during operation. In this case, the first light source can comprise exactly one light-emitting diode chip that emits red light or a multiplicity of light-emitting diode chips that emit red light during operation. Preferably, the light source comprises no light-emitting diode chips that emit light of a different color than red during operation.

In accordance with at least one embodiment of the optical projection apparatus, the second light source comprises a first light-emitting diode chip and a second light-emitting diode chip. The first light-emitting diode chip emits green light during operation and the second light-emitting diode chip emits blue light during operation. In this case, the second light-emitting diode chip is arranged on the first light-emitting diode chip at a radiation exit area of the first light-emitting diode chip. That is to say that the first and the second light-emitting diode chip are arranged in a manner stacked one above another, wherein the light-emitting diode chip that emits blue light is disposed downstream of the light-emitting diode chip that emits green light in the emission direction thereof. That is to say that electromagnetic radiation generated during the operation of the first light-emitting diode chip passes through the second light-emitting diode chip. For this purpose, the second light-emitting diode chip is embodied as radiation-transmissive for the electromagnetic radiation generated in the first light-emitting diode chip.

The first and second light-emitting diode chips can be produced in a monolithically integrated manner. That is to say that first and second light-emitting diode chips can be grown epitaxially, for example, successively in a single epitaxy installation. Alternatively, it is possible for the first and second light-emitting diode chips to be produced separately from one another and to be connected to one another, for example, by means of an adhesive-bonding process.

In this case, the second light source can comprise exactly one stack of first and second light-emitting diode chips. Furthermore, it is possible for the second light source to comprise a multiplicity of such stacks. In any event, the second light source preferably comprises only stacks of first and second light-emitting diode chips and, for example, no further light-emitting diode chips such as, for instance, red light-emitting diode chips.

In accordance with at least one embodiment of the optical projection apparatus, the optical projection apparatus comprises a first light source, a second light source and an imaging element, which is illuminated by the first and the second light source during operation. The first light source comprises a light-emitting diode chip that emits red light during operation. The second light source comprises a first light-emitting diode chip, which emits green light during operation, and a second light-emitting diode chip, which emits blue light during operation, wherein the second light-emitting diode chip is arranged on the first light-emitting diode chip at a radiation exit area of the first light-emitting diode chip, such that electromagnetic radiation generated in the first light-emitting diode chip during operation passes through the second light-emitting diode chip.

The optical projection apparatus described here is preferably a two-channel projection apparatus. In the case of a two-channel projection apparatus, one primary color, for example, green, can be generated by an individual light-emitting diode light source, while the other two primary colors, for example, red and blue, are generated by a light-emitting diode module on which red and blue light-emitting diode chips are arranged alongside one another. For superimposing and homogenizing the two color channels (firstly green and secondly blue-red), it is possible to use dichroic mirrors and optical components such as microlens arrays (so-called fly-eye arrays), or rod-type optical integrators (so-called integrator rods). By means of a lens system, the light can then be directed sequentially onto an imaging element such as, for example, a digital mirror device (DMD) and can be projected onto a screen in a magnified fashion by means of a projection optical unit.

The optical projection apparatus described here is based, then, on the following consideration. The law of conservation of etendue, according to which the etendue is proportional to $(\sin \alpha)^2 A$, states that for every microdisplay in an optical projection apparatus (that is to say, for example, for every micromirror in the imaging element of the projection apparatus), there is a maximum useable luminous area of the light-emitting diode chips of the light sources of the optical projection apparatus. In this case, the etendue of the microdisplay is determined by the area A thereof and the acceptance angle $\alpha$ thereof. Enlarging the light-emitting diode luminous area would not have a positive effect, since no additional light can be coupled into the optical system.

In the case of a two-channel projection system wherein the colors red and blue share the maximum useable luminous area, while the color green is generated by an individual light-emitting diode module, the blue and red light-emitting diode chips are operated with a higher current density since only half the luminous area of the green channel of the optical projection apparatus is available to them. However, the efficiency of a light-emitting diode decreases, primarily in the case of blue and green light-emitting diodes, greatly as the current density increases, and so the overall efficiency of the two-channel projection system is thereby detrimentally affected. The advantage of a projection system described here, comprising a second light source comprising a stacked arrangement of a green and a blue light-emitting diode chip in combination with a first light source having a red light-emitting diode chip, resides, then, in the fact that the fully useable luminous area is available for the light-emitting diode chip that emits green light and for the light-emitting diode chip that emits blue light. The current densities for the light-emitting diode chips that emit green and blue light therefore does not have to be chosen to be greater than in the case of a three-channel projection apparatus that uses a dedicated monochrome light-emitting diode module for each primary color.

In accordance with at least one embodiment of the optical projection apparatus, the first light source is provided for emitting red light and the second light source is provided for emitting green light, blue light and/or blue-green light. That is to say that, during the operation of the projection apparatus, the light sources emit light of the stated colors at least at times.

In accordance with at least one embodiment of the optical projection apparatus, the second light source has a mirror layer, which is fixed to the first light-emitting diode chip at a side remote from the second light-emitting diode chip. The mirror layer is, for example, a dielectric and/or a metallic mirror suitable for reflecting both the green light from the first light-emitting diode chip and the blue light from the second light-emitting diode chip.

In accordance with at least one embodiment of the optical projection apparatus, the optical projection apparatus comprises a control device suitable for short-circuiting the first light-emitting diode chip of the second light source during the operation of the second light-emitting diode chip of the second light source. That is to say that the control device is provided for short-circuiting the first light-emitting diode chip whenever the second light-emitting diode chip of the second light source is operated. In this way, charge carrier pairs generated in the first light-emitting diode chip cannot recombine radiatively. The first light-emitting diode chip then cannot be excited to reemit light by electromagnetic radiation from the second light-emitting diode chip.

In accordance with at least one embodiment of the optical projection apparatus, part of the blue light generated in the second light-emitting diode chip of the second light source during operation is absorbed in the first light-emitting diode chip of the second light source and the absorbed light excites the generation of green light there in such a way that the second light source emits mixed light composed of blue and green light during the operation of the second light-emitting diode chip. That is to say that, in this case, the excitation of green light in the first light-emitting diode chip by the blue light from the second light-emitting diode chip is not suppressed by a short circuit of the first light-emitting diode chip, rather green light is additionally generated.

In accordance with at least one embodiment of the optical projection apparatus, the control device has two operating states. In a first operating state, the first light-emitting diode chip of the second light source is short-circuited during the operation of the second light-emitting diode chip of the second light source, such that the second light source emits color-pure, blue light during the operation of the second light-emitting diode chip. In the second operating state, the first light-emitting diode chip is not short-circuited during the operation of the second light-emitting diode of the second light source, such that the second light source emits mixed light composed of blue and green light during the operation of the second light-emitting diode chip.

That is to say that, by means of the control device, it is possible to choose whether the second light source emits color-pure blue light or whether the second light source emits blue-green mixed light.

In the first operating state, the projection apparatus is suitable for representing images in a particularly large color space. In the second operating state, the color space is restricted since pure blue light is not generated. On the other hand, however, the efficiency of the second light source is increased since part of the blue stray light is used to generate green light.

In accordance with at least one embodiment of the optical projection apparatus, a lens is optically connected to a radiation exit area of the light-emitting diode chip of the first light source. In this case, optically connected means that the lens is disposed downstream of the light-emitting diode chip without an air gap. By way of example, the lens can be placed directly onto the radiation exit area of the light-emitting diode chip. Furthermore, it is possible for the lens to be connected to the light-emitting diode chip by means of, for example, an index matching gel or an optical adhesive. Although the lens has the disadvantage that the useable luminous area of the light-emitting diode chip is reduced, the coupling-out efficiency of the red light from the light-emitting diode chip is increased by up to 70%, such that the efficiency of the optical projection apparatus is increased further.

In accordance with at least one embodiment of the optical projection apparatus, a dichroic mirror is arranged in the light path between the first light source and the imaging element and in the light path between the second light source and the imaging element, the dichroic mirror being suitable for directing the light from the first light source and the light from the second light source onto the imaging element. In this case, the dichroic mirror can be constructed in a significantly less complicated manner than is the case for a two-channel projection apparatus wherein blue and red light-emitting diode chips are arranged to form a common light-emitting diode module. This is based on the fact, inter alia, that the difference in wavelength between green and blue light is significantly smaller than the difference between red and blue light. On account of the simpler dichroic mirror, the optical projection apparatus has reduced Fresnel filter losses and hence an increased efficiency.

In accordance with at least one embodiment of the optical projection apparatus, no optical element is arranged respectively in the light path between the first light source and the imaging element and in the light path between the second light source and the imaging element. That is to say that the light paths are free of optical elements. In other words, the first and the second light source directly illuminate the imaging element. By way of example, a dichroic mirror is completely dispensed with in this case. By means of slight defocusing of the two light sources, a sufficient homogeneity of the illumination of the imaging element can also be achieved without further optical components. The three primary colors are then mixed directly at the imaging element, which allows for a very compact design of the optical projection apparatus whilst avoiding Fresnel losses. The optical projection apparatus is therefore distinguished by a particularly high efficiency.

BRIEF DESCRIPTION OF THE DRAWINGS

The optical projection apparatus described here is explained in greater detail below on the basis of exemplary embodiments and the associated figures.

FIGS. 1A and 1B show, on the basis of schematic sectional illustrations, embodiments of a second light source for an optical projection apparatus described here;

FIG. 1C shows, on the basis of a schematic circuit diagram, the interconnection of the second light source of an optical projection apparatus described here;

FIGS. 2A, 2B and 2C serve for elucidating properties of an optical projection apparatus described here on the basis of graphical plots;

DETAILED DESCRIPTION OF ILLUSTRATIVE EMBODIMENTS

Figure 2B:
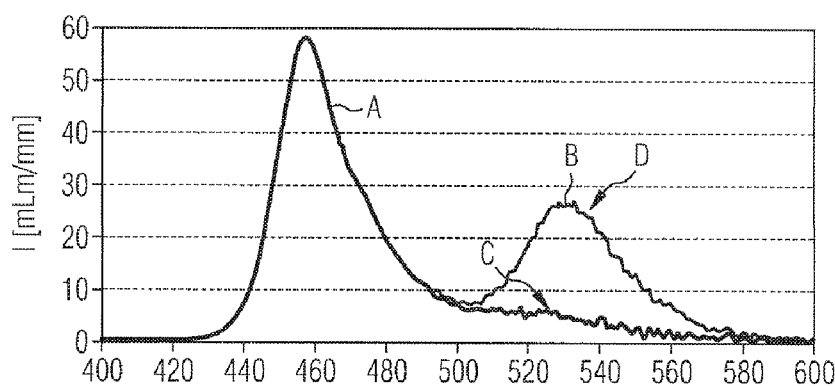

Elements that are identical, of identical type or act identically are provided with the same reference symbols in the figures. The figures and the size relationships of the elements illustrated in the figures among one another should not be regarded as to scale. Rather, individual elements may be illustrated with an exaggerated size in order to enable better illustration and/or in order to afford a better understanding.

FIG. 1A shows a first embodiment of a second light source 2 for an optical projection apparatus described here. The second light source 2 comprises a first light-emitting diode chip 21 and a second light-emitting diode chip 22. Furthermore, the second light source 2 comprises a carrier 25. A mirror layer 26 is arranged between the carrier 25 and the first light-emitting diode chip 21. First light-emitting diode chip 21 and second light-emitting diode chip 22 are connected to one another via a connecting means 23. A contact layer 24 is situated at that side of the second light-emitting diode chip 22 which faces the first light-emitting diode chip 21, the contact layer being configured in a radiation-transmissive fashion.

The first light-emitting diode chip 21 is a light-emitting diode chip that emits green light and that is likewise based on the InGaN semiconductor material system.

The second light-emitting diode chip 22 is a substrateless blue light-emitting diode chip that is radiation-transmissive to green light and is based on the InGaN semiconductor material system, for example.

The mirror layer 26 is, for example, a silver mirror suitable for reflecting both green and blue light. The carrier 25 is formed from germanium, for example.

The connecting means 23 is embodied in a radiation-transmissive fashion and formed from silicone and/or epoxy resin, for example. The radiation-transmissive contact layer 24 is formed from a TCO (transparent conductive oxide), for example, such as ITO (indium tin oxide), or IZO (indium zinc oxide), for instance.

The first light-emitting diode chip 21 can have coupling-out structures 211 formed, for example, by roughenings of the radiation exit area 212 of the first light-emitting diode chip 21. The radiation exit area faces the second light-emitting diode chip 22.

In the same way, the second light-emitting diode chip 22 can also have coupling-out structures 221. The coupling-out structures 221 of the second light-emitting diode chip 22 can also be formed by roughenings. The coupling-out structures 211, 221 in each case increase the probability of the passage of radiation through the radiation exit areas of the light-emitting diode chips.

During the operation of the second light source 2, the second light-emitting diode chip 22 emits blue light, for example. In this case, part of the blue light can pass into the first light-emitting diode chip 21. The blue light is partly absorbed in the first light-emitting diode chip 21 and part of the absorbed light is converted to green light in the first light-emitting diode chip 21. Another part of the blue light that has passed into the first light-emitting diode chip 21 is reflected at the mirror layer 26 toward the second light-emitting diode chip 22 and emerges as blue light from the second light source 2. The green light (approximately 30% of the total luminous flux of the second light source), excited by the blue light can be used for light generation, as a result of which the second light source 2 emits blue-green mixed light. Although this decreases the size of the color space of the optical projection apparatus, it increases the efficiency thereof.

Alternatively, the excitation of green light can be suppressed by a short circuit of the first light-emitting diode chip 21 during the operation of the second light-emitting diode chip 22. One circuit for this purpose is illustrated in greater detail, for example, in FIG. 1C. For this purpose, the second light source 2 comprises a control device 30, which is realized by a switch. The contact locations 29a, 29b of the first light-emitting diode chip 21 can be short-circuited by the control device 30, such that no electromagnetic radiation can be generated in the first light-emitting diode chip 21 during the operation of the second light-emitting diode chip 22.

The control device 30 therefore has a first operating state, in which the first light-emitting diode chip 21 of the second light source 2 is short-circuited during the operation of the second light-emitting diode chip 22 of the second light source 2 in such a way that the second light source 2 emits blue light during the operation of the second light-emitting diode chip 22, and a second operating state, in which the second light source 2 emits mixed light composed of blue and green light during the operation of the second light-emitting diode chip 22.

FIG. 1B shows, on the basis of a schematic sectional illustration, a second embodiment of a second light source 2 such as can be used in an optical projection apparatus described here. In this embodiment, the first light-emitting diode chip 21 and the second light-emitting diode chip 22 are constructed in a monolithically integrated manner. That is to say that they are deposited epitaxially one on top of another, such that no connecting means 23 for connecting first light-emitting diode chip 21 and second light-emitting diode chip 22 is necessary. In this case, contact is made with the light-emitting diode chips by means of channels 27a, 27b, 28, which are filled with an electrically conductive material and extend into the contact layers of the light-emitting diode chips 21, 22. Contact is made with the light-emitting diode chips 21, 22 via the connection locations 29a, 29b, 29c.

By comparison with the light source described in conjunction with FIG. 1A, the light source described in FIG. 1B is distinguished by an increased efficiency. This is based on the fact, in particular, that no absorption of electromagnetic radiation can take place in the connecting means 23 or in the contact layer 24. On the other hand, the production of the second light source 2 as shown in FIG. 1B involves a greater outlay on account of the complicated phototechnology necessary for producing the channels 27a, 27b, 28.

FIG. 2A shows the coupling-out efficiency E for second light sources 2 as shown in FIG. 1A. In this case, the bar A shows the efficiency for a second light source 2 comprising a contact layer 24 having a thickness of 100 nm and formed from IZO. The bar B shows the efficiency for a second light source 2 comprising a contact layer 24 having a thickness of 250 nm and formed from IZO. In this case, the coupling-out efficiency for the bar A is approximately 80%, and for the bar B is approximately 67%. That is to say that optical losses of at least 20% should be expected on account of the contact layer 24.

FIG. 2B shows the intensity in mlm/nm plotted against the wavelength for a second light source 2 wherein the generation of green light is prevented by the short-circuiting of the first light-emitting diode chip 21, see curve A. Furthermore, FIG. 2B shows the intensity of a second light source 2 when the generation of green light is not prevented if the second light-emitting diode chip 22 is operated, see curve B. In this case, the increase in intensity at point D can be attributed to the excitation of green photons by the blue photons from the second light-emitting diode chip 22. The generation of green light can be suppressed by the short-circuiting of the first light-emitting diode chip 21, see region C.

Figure 2C:
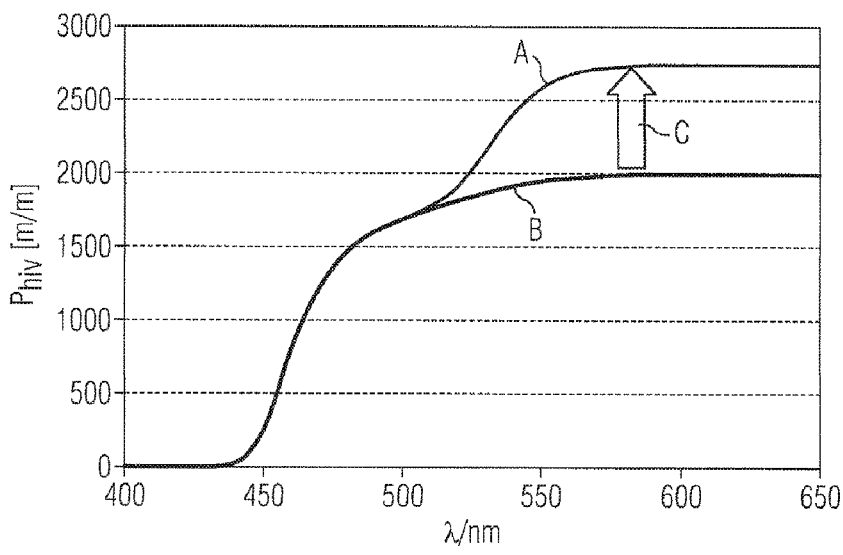

FIG. 2C shows the cumulated luminous flux PhiV in mlm as a function of the wavelength for a second light source 2 wherein the generation of green light in the first light-emitting diode chip 21 is prevented during the operation of the second light-emitting diode chip 22, see curve B. Furthermore, curve A illustrates the cumulated luminous flux for the case where the generation of green light is not prevented. As can be seen from FIG. 2C, the green light of the first light-emitting diode chip 21 can be used for increasing the efficiency by approximately 30% of the total luminous flux (also see arrow C). By contrast, a larger color space results when the generation of the green light is suppressed.

Figure 3:
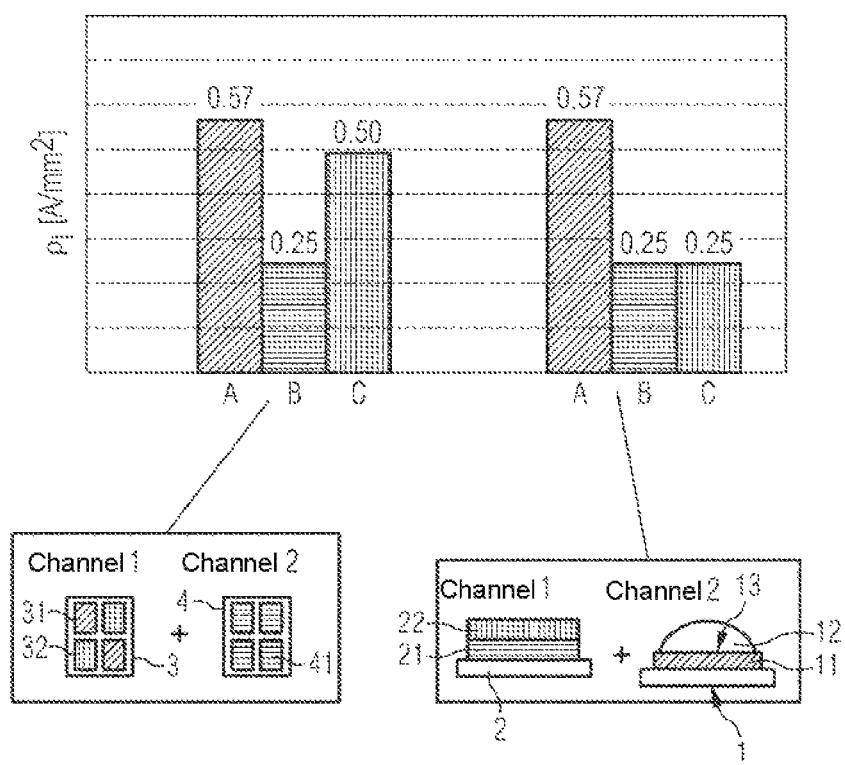
FIG. 3 shows a graphical plot on the basis of which properties of the optical projection apparatus described here are elucidated in greater detail.

FIG. 3 shows the current density ρI in amperes per square millimeter for two different two-channel projection apparatuses. The optical projection apparatus is in this case a 16:9 projection apparatus having a 0.3" microdisplay and a total power of 1 W. In this case, the bars A show the current density of the red light-emitting diode chips, the bars B show the current density of the green light-emitting diode chips and the bars C show the current density of the blue light-emitting diode chips.

The bars on the left-hand side show the current density for the situation as shown in the box illustrated underneath. In this case, the optical projection apparatus comprises a first light source 3 comprising red light-emitting diode chips 31 and blue light-emitting diode chips 32. Furthermore, the optical projection apparatus comprises a second light source 4 comprising only green light-emitting diode chips 41.

The right hand bars concern an optical projection apparatus comprising stacked green light-emitting diode chips 21 and blue light-emitting diode chips 22 in the second light source 2 and a red light-emitting diode chip 11 in the first light source 1, downstream of which a lens 12 is disposed directly at its radiation coupling-out area 13.

As can be seen from the plot in FIG. 3, the current density of the blue chip in the case illustrated on the right is 50% of the situation illustrated on the left. This results in an increased efficiency of the optical projection apparatus.

Figure 4A:
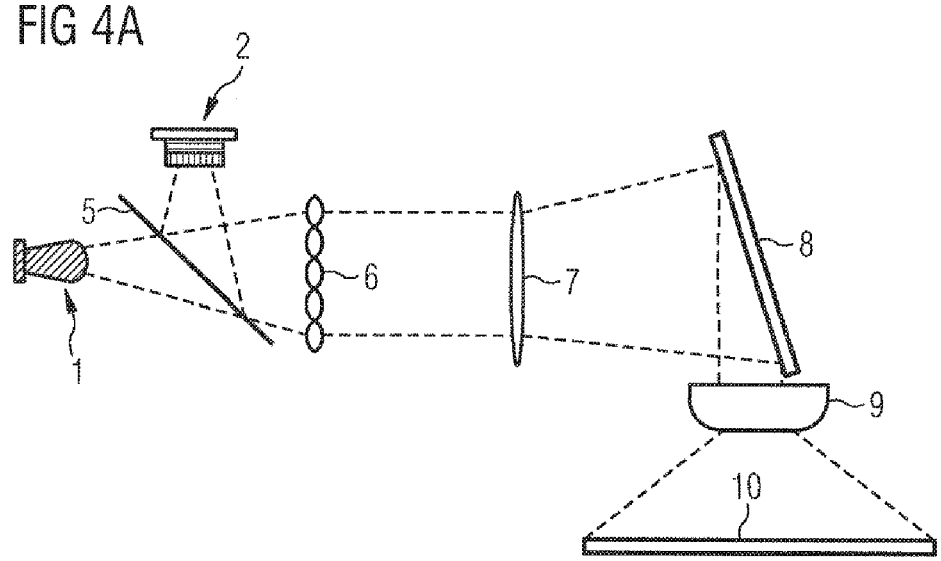
FIGS. 4A and 4B show exemplary embodiments of optical projection apparatuses described here in schematic sectional illustrations.

FIG. 4A shows an optical projection apparatus described here in a schematic sectional illustration in accordance with a first embodiment. The optical projection apparatus comprises a first light source 1 as shown in FIG. 3, for example. Furthermore, the optical projection apparatus comprises a second light source 2 as described in greater detail in conjunction with FIGS. 1A and 1B, for example. The optical projection apparatus furthermore comprises a dichroic mirror 5, which combines the light beams from the first light source 1 and the second light source 2 in a single light path. The optical projection apparatus furthermore comprises optical elements 6, 7, which can be, for example, a microlens array 6 and a rod-type mixing optical unit 7. The light from the first and the second light source is alternately directed onto the imaging element 8, which is a micromirror array, for example. The light modulated by the imaging element 8 is directed onto the projection area 10 by a projection optical unit 9.

Figure 4B:
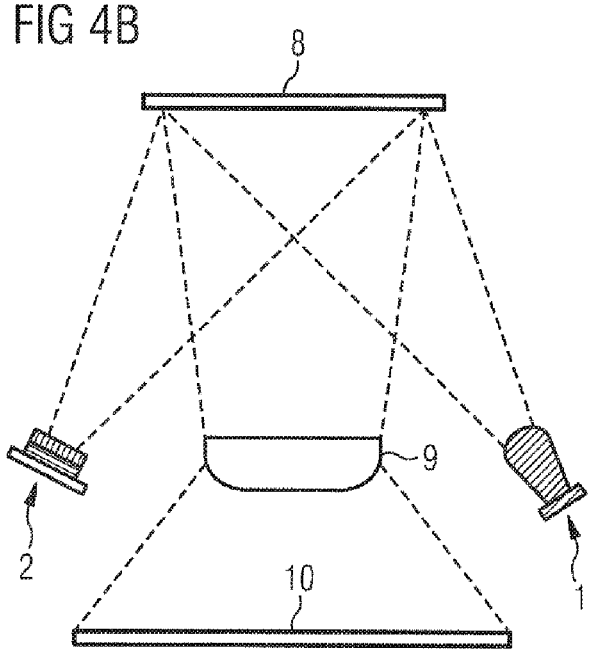

An optical projection apparatus wherein optical elements between the light sources 1, 2 and the imaging element 8 are dispensed with is shown in conjunction with FIG. 4B. In this case, the light from the light sources 1, 2 is homogenized by slight defocusing of the two light sources, such that the light mixing can take place directly at the imaging element 8.

Overall, the reduction of the current density for the blue light-emitting diode chips and the use of a coupling-out lens 12 for the red light-emitting diode chips result overall in an increase in the efficiency of the optical projection apparatus by approximately 30% compared with an optical projection apparatus comprising a light-emitting diode module having blue and red light-emitting diode chips and a light-emitting diode module having green light-emitting diode chips.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

By way of example, the scope of the protection of the claims also extends to optical projection apparatuses wherein use is made of light-emitting diode chips other than light-emitting diode chips that emit red light, green light and blue light. All that is important is that the generated light of the light-emitting diode chips can be mixed to form white light. At least one light-emitting diode chip in a first wavelength range is then used in the first light source.

In the second light source, use is made of at least one light-emitting diode chip in a second wavelength range as first light-emitting diode chip and at least one light-emitting diode chip in a third wavelength range as second light-emitting diode chip. In this case, the first wavelength range encompasses electromagnetic radiation having the longest wavelengths, the second wavelength range encompasses electromagnetic radiation having medium wavelengths, and the third wavelength range encompasses electromagnetic radiation having the shortest wavelengths.

The invention claimed is:
1. An optical projection apparatus comprising:
a first light source,
a second light source, and
an imaging element located to be illuminated by the first light source and the second light source during operation,
wherein the first light source comprises a third light-emitting diode chip that emits red light during operation,
wherein the second light source comprises a first light-emitting diode chip that emits green light during operation and a second light-emitting diode chip that emits blue light during operation, wherein the second light-emitting diode chip is arranged on the first light-emitting diode chip at a radiation exit area of the first light-emitting diode chip, such that electromagnetic radiation generated in the first light-emitting diode chip during operation passes through the second light-emitting diode chip, and
wherein the first light source is provided for emitting red light and the second light source is provided for emitting green light, blue light and/or mixed light composed of blue and green light.

2. The optical projection apparatus according to claim 1, wherein the second light source comprises a minor layer fixed to the first light-emitting diode chip at a side remote from the second light-emitting diode chip.

3. The optical projection apparatus according to claim 1, further comprising a control device suitable for causing short-circuiting of the first light-emitting diode chip of the second light source during the operation of the second light-emitting diode chip of the second light source.

4. The optical projection apparatus according to claim 1, wherein part of the blue light generated in the second light-emitting diode chip of the second light source during operation is absorbed in the first light-emitting diode chip of the second light source and excites the generation of green light there in such a way that the second light source emits mixed light composed of blue and green light during the operation of the second light-emitting diode chip.

5. The optical projection apparatus according to claim 3, wherein the control device
   has a first operating state, in which the first light-emitting diode chip of the second light source is short-circuited during the operation of the second light-emitting diode chip of the second light source in such a way that the second light source emits blue light during the operation of the second light-emitting diode chip, and
   has a second operating state, in which the second light source emits mixed light composed of blue and green light during the operation of the second light-emitting diode chip.

6. The optical projection apparatus according to claim 1, further comprising a lens optically connected to the radiation exit area of the light-emitting diode chip of the first light source.

7. The optical projection apparatus according to claim 1, further comprising a dichroic mirror arranged in both a first light path between the first light source and the imaging element and in a second light path between the second light source and the imaging element.

8. The optical projection apparatus according to claim 1, wherein a first light path between the first light source and the imaging element and a second light path between the second light source and the imaging element are both free of optical elements.

9. The optical projection apparatus according to claim 1, wherein the first light source and the second light source directly illuminate the imaging element.

10. An optical projection apparatus comprising:
    a first light source,
    a second light source, and
    an imaging element, which is illuminated by the first and the second light source during operation,
    wherein the first light source comprises a third light-emitting diode chip that emits red light during operation,
    wherein the second light source comprises a first light-emitting diode chip that emits green light during operation and a second light-emitting diode chip that emits blue light during operation, wherein the second light-emitting diode chip is arranged on the first light-emitting diode chip at a radiation exit area of the first light-emitting diode chip, such that electromagnetic radiation generated in the first light-emitting diode chip during operation passes through the second light-emitting diode chip,
    wherein the first light source is provided for emitting red light and the second light source is provided for emitting green light, blue light and mixed light composed of blue and green light; and
    wherein the second light source comprises a mirror layer fixed to the first light-emitting diode chip at a side remote from the second light-emitting diode chip; and
    wherein the optical projection apparatus further comprises a control device suitable for causing short-circuiting of the first light-emitting diode chip of the second light source during the operation of the second light-emitting diode chip of the second light source.

11. An optical projection apparatus comprising:
    a first light source,
    a second light source, and
    an imaging element, which is illuminated by the first light source and the second light source during operation,
    wherein the first light source comprises a third light-emitting diode chip that emits red light during operation,
    wherein the second light source comprises a first light-emitting diode chip that emits green light during operation, and a second light-emitting diode chip that emits blue light during operation, wherein the second light-emitting diode chip is arranged on the first light-emitting diode chip at a radiation exit area of the first light-emitting diode chip, such that electromagnetic radiation generated in the first light-emitting diode chip during operation passes through the second light-emitting diode chip,
    wherein the first light source is provided for emitting red light and the second light source is provided for emitting light different from red light, during operation, and
    wherein a first light path between the first light source and the imaging element and a second light path between the second light source and the imaging element are both free of optical elements.

12. The optical projection apparatus according to claim 11, wherein the second light source comprises a minor layer fixed to the first light-emitting diode chip at a side remote from the second light-emitting diode chip.

13. The optical projection apparatus according to claim 11, further comprising a control device suitable for causing short-circuiting of the first light-emitting diode chip of the second light source during the operation of the second light-emitting diode chip of the second light source.

14. The optical projection apparatus according to claim 11, wherein part of the blue light generated in the second light-emitting diode chip of the second light source during operation is absorbed in the first light-emitting diode chip of the second light source and excites the generation of green light there in such a way that the second light source emits mixed light composed of blue and green light during the operation of the second light-emitting diode chip.

15. The optical projection apparatus according to claim 13, wherein the control device
    has a first operating state, in which the first light-emitting diode chip of the second light source is short-circuited during the operation of the second light-emitting diode chip of the second light source in such a way that the second light source emits blue light during the operation of the second light-emitting diode chip, and
    has a second operating state, in which the second light source emits mixed light composed of blue and green light during the operation of the second light-emitting diode chip.

16. The optical projection apparatus according to claim 11, further comprising a lens optically connected to the radiation exit area of the light-emitting diode chip of the first light source.

17. The optical projection apparatus according to claim 10, further comprising a dichroic minor arranged in both a first light path between the first light source and the imaging element and in a second light path between the second light source and the imaging element.

18. The optical projection apparatus according to claim 10, wherein a first light path between the first light source and the imaging element and a second light path between the second light source and the imaging element are both free of optical elements.

19. The optical projection apparatus according to claim 11, wherein the first light source and the second light source directly illuminate the imaging element.

* * * * *

UNITED STATES PATENT AND TRADEMARK OFFICE
CERTIFICATE OF CORRECTION

PATENT NO. : 8,684,540 B2
APPLICATION NO. : 13/378308
DATED : April 1, 2014
INVENTOR(S) : Stefan Groetsch et al.

It is certified that error appears in the above-identified patent and that said Letters Patent is hereby corrected as shown below:

In the Claims:

In Col. 9, line 2, claim 2, delete "minor" and insert --mirror--.
In Col. 10, line 34, claim 12, delete "minor" and insert --mirror--.
In Col. 10, line 67, claim 17, delete "minor" and insert --mirror--.

Signed and Sealed this
Third Day of June, 2014

Michelle K. Lee
*Deputy Director of the United States Patent and Trademark Office*

UNITED STATES PATENT AND TRADEMARK OFFICE
CERTIFICATE OF CORRECTION

PATENT NO. : 8,684,540 B2  Page 1 of 1
APPLICATION NO. : 13/378308
DATED : April 1, 2014
INVENTOR(S) : Grötsch et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 254 days.

Signed and Sealed this
Twenty-ninth Day of September, 2015

Michelle K. Lee
*Director of the United States Patent and Trademark Office*